(12) United States Patent
Hudgins et al.

(10) Patent No.: US 11,209,869 B2
(45) Date of Patent: Dec. 28, 2021

(54) ATTACHABLE DISPLAYS SCREEN FOR ELECTRONIC DEVICES

(71) Applicant: Stand Steady Company, LLC, Birmingham, AL (US)

(72) Inventors: Edward Tyler Hudgins, Arlington, VA (US); Antoine Planche, Arlington, VA (US)

(73) Assignee: Stand Steady Company, LLC, Birmingham, AL (US)

( * ) Notice: Subject to any disclaimer, the term of this patent is extended or adjusted under 35 U.S.C. 154(b) by 39 days.

(21) Appl. No.: 16/289,315

(22) Filed: Feb. 28, 2019

(65) Prior Publication Data

US 2020/0278722 A1 Sep. 3, 2020

(51) Int. Cl.
*G06F 1/16* (2006.01)
*H05K 5/00* (2006.01)
*H05K 5/02* (2006.01)

(52) U.S. Cl.
CPC .......... *G06F 1/1654* (2013.01); *G06F 1/1643* (2013.01); *G06F 1/1647* (2013.01); *G06F 1/1681* (2013.01); *H05K 5/0017* (2013.01); *H05K 5/0204* (2013.01); *H05K 5/0226* (2013.01); *H05K 5/0247* (2013.01)

(58) Field of Classification Search
CPC .... G06F 1/1647; G06F 1/1649; G06F 1/1654; G06F 1/1681; G06F 1/1643; G06F 1/1616; H05K 5/0247; H05K 5/0204; H05K 5/0226; H05K 5/0017
See application file for complete search history.

(56) References Cited

U.S. PATENT DOCUMENTS

| 5,590,021 A | 12/1996 | Register |
| 5,768,096 A | 6/1998 | Williams et al. |
| 6,222,507 B1 | 4/2001 | Gouko |
| 6,295,038 B1 | 9/2001 | Rebeske |
| 6,302,612 B1 | 10/2001 | Fowler et al. |
| 6,532,146 B1 | 3/2003 | Duquette |

(Continued)

FOREIGN PATENT DOCUMENTS

| WO | 03044378 | 5/2003 | |
| WO | WO-2009130981 A | * 10/2009 | ........... G06F 1/1637 |
| WO | 2019212969 | 11/2019 | |

OTHER PUBLICATIONS

Robyn, "Ten 1 Design Mountie + Review", Mac Sources; Article [online], Feb. 7, 2018, Retrieved from the Internet <URL; http://macsources.com/ten-1-design-mountie-review/>.

(Continued)

*Primary Examiner* — Rockshana D Chowdhury
*Assistant Examiner* — Douglas R Burtner
(74) *Attorney, Agent, or Firm* — Bradley Arant Boult Cummings LLP (57) ABSTRACT

The present disclosure provides an attachable external display screen for use on electronic devices. The display screen may be removably mounted onto a surface of an electronic device to provide the user with an additional display screen. The attachable display screen utilizes a dual sliding mechanism that allows for the display screen to slide out to different lengths relative to the screen of the electronic device. The attachable display screen is also rotatable about a vertical axis, which allows a user to adjust the angle of the display screen.

18 Claims, 7 Drawing Sheets

(56) References Cited

U.S. PATENT DOCUMENTS

| | | | |
|---|---|---|---|
| 6,643,124 | B1 | 11/2003 | Wilk |
| 6,667,877 | B2 * | 12/2003 | Duquette ............ G06F 1/1607 248/917 |
| 6,667,878 | B2 | 12/2003 | Ponx |
| 6,778,383 | B2 | 8/2004 | Ho |
| 6,794,798 | B2 | 9/2004 | Watanabe et al. |
| 6,859,219 | B1 | 2/2005 | Sall |
| 6,967,632 | B1 | 11/2005 | Minami et al. |
| 7,136,282 | B1 | 11/2006 | Rebeske |
| 7,283,353 | B1 | 10/2007 | Jordan et al. |
| 7,375,954 | B2 | 5/2008 | Kang |
| 7,460,364 | B2 | 12/2008 | Yang |
| 7,633,744 | B2 | 12/2009 | Kuhn |
| 7,660,914 | B2 | 2/2010 | Perez et al. |
| D615,082 | S | 5/2010 | Taichi |
| 7,752,789 | B2 | 7/2010 | Sun et al. |
| 7,813,118 | B2 | 10/2010 | Burge |
| 7,830,333 | B2 | 11/2010 | Aoki |
| 7,848,091 | B2 | 12/2010 | Han et al. |
| D630,204 | S | 1/2011 | Kovac |
| D630,205 | S | 1/2011 | Kovac |
| D630,206 | S | 1/2011 | Kovac |
| D630,628 | S | 1/2011 | Kovac |
| D634,745 | S | 3/2011 | Park et al. |
| 7,936,558 | B2 | 5/2011 | Chang |
| 7,952,866 | B2 | 5/2011 | Lee et al. |
| 7,986,517 | B2 | 7/2011 | Jiang et al. |
| 7,990,338 | B2 | 8/2011 | Teng et al. |
| 7,991,442 | B2 | 8/2011 | Kim |
| 8,018,715 | B2 | 9/2011 | Chang |
| 8,064,193 | B2 | 11/2011 | Thabit |
| D652,832 | S | 1/2012 | Wu et al. |
| 8,098,231 | B2 | 1/2012 | Jacobs et al. |
| 8,243,471 | B2 | 8/2012 | Liang |
| 8,314,751 | B2 | 11/2012 | Yang |
| 8,317,146 | B2 | 11/2012 | Jung et al. |
| 8,405,571 | B2 | 3/2013 | Chung |
| 8,529,111 | B2 | 9/2013 | Chang |
| 8,560,003 | B2 | 10/2013 | Kwak et al. |
| 8,681,486 | B2 | 3/2014 | Singhal |
| 8,773,378 | B2 | 7/2014 | Sirpal et al. |
| D715,301 | S | 10/2014 | Ashcraft et al. |
| 8,963,840 | B2 | 2/2015 | Sirpal et al. |
| D727,895 | S | 4/2015 | Aoki et al. |
| 9,047,038 | B2 | 6/2015 | Sirpal et al. |
| 9,092,190 | B2 | 7/2015 | Sirpal et al. |
| 9,104,365 | B2 | 8/2015 | Sirpal et al. |
| 9,304,553 | B2 | 4/2016 | Park et al. |
| D761,800 | S | 7/2016 | Muller |
| 9,441,782 | B2 | 9/2016 | Funk et al. |
| 9,477,394 | B2 | 10/2016 | Sirpal et al. |
| 9,568,952 | B2 | 2/2017 | Matzke et al. |
| 9,594,397 | B2 | 3/2017 | Kiyamura et al. |
| 9,696,760 | B1 | 7/2017 | Zhang |
| 9,707,722 | B2 | 7/2017 | Nukada et al. |
| 9,727,295 | B2 | 8/2017 | Holung et al. |
| 9,766,850 | B2 | 9/2017 | Eisenberg |
| 9,811,302 | B2 | 11/2017 | Jouin |
| D808,950 | S | 1/2018 | Miele et al. |
| 10,001,806 | B2 | 6/2018 | Cheng et al. |
| 10,078,483 | B2 | 9/2018 | Finnan |
| 10,082,832 | B1 | 9/2018 | Wang et al. |
| 10,550,995 | B1 | 2/2020 | Hung et al. |
| D883,990 | S | 5/2020 | Tao et al. |
| 10,809,762 | B1 | 10/2020 | Levine |
| 2003/0218577 | A1 | 11/2003 | Wang |
| 2004/0051679 | A1 | 3/2004 | Ponx |
| 2005/0162821 | A1 | 7/2005 | Homer et al. |
| 2005/0237699 | A1 | 10/2005 | Carroll |
| 2005/0253775 | A1 | 11/2005 | Stewart |
| 2005/0270730 | A1 | 12/2005 | Klushin et al. |
| 2006/0082518 | A1 * | 4/2006 | Ram ................ G06F 3/1446 345/1.1 |
| 2006/0268500 | A1 | 11/2006 | Kuhn |
| 2007/0080950 | A1 | 4/2007 | Lee et al. |
| 2007/0086154 | A1 | 4/2007 | Koch |
| 2007/0127196 | A1 | 6/2007 | King |
| 2008/0179895 | A1 * | 7/2008 | Lin .................. E05B 65/006 292/116 |
| 2008/0198096 | A1 | 8/2008 | Jung |
| 2008/0252555 | A1 | 10/2008 | Jeon |
| 2009/0100732 | A1 | 4/2009 | Seidler |
| 2009/0102744 | A1 * | 4/2009 | Ram ................ G06F 1/1624 345/1.1 |
| 2009/0146911 | A1 | 6/2009 | Kang |
| 2009/0273539 | A1 | 11/2009 | Pruett |
| 2010/0024271 | A1 | 2/2010 | Seidler |
| 2010/0039350 | A1 | 2/2010 | Wakefield et al. |
| 2010/0053027 | A1 | 3/2010 | Tonnison et al. |
| 2011/0216483 | A1 * | 9/2011 | Vesely ............. G06F 1/1624 361/679.01 |
| 2011/0228463 | A1 | 9/2011 | Matagne |
| 2011/0247249 | A1 | 10/2011 | Cao |
| 2011/0298690 | A1 | 12/2011 | Reilly |
| 2012/0127646 | A1 | 5/2012 | Moscovitch |
| 2012/0186583 | A1 * | 7/2012 | Drapes ............... F16M 11/08 128/203.12 |
| 2012/0223872 | A1 * | 9/2012 | Ram ................ H04M 1/0266 345/1.3 |
| 2013/0277271 | A1 * | 10/2013 | Toulotte ........... A45C 13/1069 206/752 |
| 2014/0085814 | A1 * | 3/2014 | Kielland ............ F16M 11/10 361/679.55 |
| 2014/0118262 | A1 * | 5/2014 | Lin .................. G06F 1/1616 345/168 |
| 2015/0212546 | A1 | 7/2015 | Ram |
| 2015/0378393 | A1 | 12/2015 | Erad et al. |
| 2016/0124466 | A1 | 5/2016 | Ram |
| 2016/0154434 | A1 | 6/2016 | Lakhani |
| 2016/0320797 | A1 | 11/2016 | Ram |
| 2017/0003712 | A1 | 1/2017 | Funk et al. |
| 2017/0023980 | A1 | 1/2017 | Marseille |
| 2017/0147038 | A1 | 5/2017 | Cody |
| 2017/0255232 | A1 | 9/2017 | Ram |
| 2018/0088630 | A1 | 3/2018 | Ram |
| 2018/0189012 | A1 | 7/2018 | Fang |
| 2018/0275717 | A1 | 9/2018 | Ram |
| 2019/0138054 | A1 * | 5/2019 | Alva ................ G06F 1/1637 |
| 2019/0332146 | A1 | 10/2019 | Tao et al. |

OTHER PUBLICATIONS

"Slidenjoy: Prototype Preview"; Sliden Joy; Video [online], Dec. 5, 2016; <URL: https://www.youtube.com/watch?v=hkbo5OeX94w &list=UUEwspWGCBCpYywFMCgGUuVA&Index=4>; entire video.

"Mobile Pixels: The Mobile Laptop Monitor"; Mobile Pixels; Video [online]. Jan. 12, 2017: <URL: https://www.facebook.com/pg/MobilePixelsUSA/posts/?ref=page_internal>; entire video.

"DUO: Kickstarter's Completely Portable Dual-Screen Laptop Accessory"; <URL: http://www.youtube.com/watch?v=3ccSagT42m8>, (PRODUCTHYPE) Jun. 19, 2018 (Jun. 19, 2018), entire video.

International Search Report and Written Opinion dated Jun. 10, 2020 of corresponding International Patent Application No. PCT/US20/20079.

"Slidenjoy—Le Slide", 2018, Retrieved from the Internet: <www.yourslide.com>.

"DUO: The on-the-go dual screen laptop monitor", 2019, Retrieved from the Internet: <www.kickstarter.com/projects/747287659/duo-the-on-the-go-dual-screen-laptop-monitor>.

"Packed Pixels Go and Packed Pixels 4K", 2019, Retrieved from the Internet: <www.packedpixels.com>.

* cited by examiner

ATTACHABLE DISPLAYS SCREEN FOR ELECTRONIC DEVICES

FIELD OF THE DISCLOSURE

The present disclosure relates generally to attachable display accessories for portable electronic devices. More particularly, the disclosure relates to a slidable and rotatable display screen that attaches to an electronic device.

BACKGROUND

Conventional portable electronic devices, such as laptop computers, are generally provided with a single display screen. Users need to switch among windows on the screen when viewing different graphics or processing different files of data at the same time. This causes inconvenience to the user and does not satisfy user requirements. While attachable display accessories, such as attachable display screens, have been developed, these accessories are bulky and are not easily transportable. In addition, the attachable display screens currently on the market are designed to fit a specific electronic device. If a user purchases a new electronic device of a different size, the attachable display screen must be replaced with one that fits the new device or the positioning of the attachable display screen must be adjusted.

Accordingly, there remains a need in the art for an attachable display screen that is compact, easily transportable, and can be used on different sized electronic devices without having to adjust the positioning of the attachable display screen.

SUMMARY

The present disclosure is directed to an attachable display device including a frame including an upper track, a lower track, and a receiving space disposed therebetween, a display screen slidably attached to an upper slide rail and a lower slide rail, wherein the upper slide rail and the lower slide rail are operatively coupled to the upper track and the lower track, wherein the display screen comprises a pivot joint that slidably couples the display screen to each of the upper slide rail and the lower slide rail, the display screen rotatable about a vertical axis via the pivot joint, and wherein the display screen is operable to selectively transition between a closed position in which the display screen is positioned within the receiving space and an open position in which the upper slide rail and the lower slide rail are configured for slidable deployment along the upper track and the lower track to a first horizontal distance and the display screen is configured for slidable deployment along the upper slide rail and the lower slide rail to a second horizontal distance. In this aspect, the second horizontal distance is greater than the first horizontal distance.

In one embodiment, the attachable display device further includes a torque hinge operatively connected to the pivot joint. In another embodiment, the pivot joint is operatively connected to the display screen by a post that is embedded within the display screen. The display screen may further include an electrical connector mounted therein and accessible from outside the display screen. In still another embodiment, the upper track and the lower track each include an elongated guide slot. In yet another embodiment, the upper track and the lower track further include a puck slidably attached thereto at each elongated guide slot.

The present disclosure is also directed to an attachable display device including a mounting frame including an upper track and a lower track, the upper track and the lower track each having an elongated guide slot, a puck slidably attached to the upper track and the lower track at each elongated guide slot, and a receiving space disposed between the upper track and the lower track, a display screen slidably attached to an upper slide rail and a lower slide rail, wherein the upper slide rail and the lower slide rail are operatively connected to the upper track and the lower track by the pucks, the display screen including a pivot joint that couples the display screen to each of the upper slide rail and the lower slide rail and is slidably attached to the upper slide rail and the lower slide rail, and a torque hinge operatively connected to the pivot joint, wherein the display screen is rotatable about a vertical axis via the pivot joint and the torque hinge, wherein the display screen is operable to selectively transition between a closed position in which the display screen is positioned within the receiving space and an open position in which the display screen extends outwardly of the mounting frame to be exposed from one side of the mounting frame, and wherein, in the open position, the display screen is configured to be slidably deployed to varying horizontal distances. In one embodiment, in the open position, the upper slide rail and the lower slide rail are configured for slidable deployment to a first horizontal distance and the display screen is configured for slidable deployment along the upper slide rail and the lower slide rail to a second horizontal distance that is greater than the first horizontal distance.

According to another embodiment, the display screen is rotatable about the vertical axis to an angle of 180 degrees allowing the display screen to be deployed in a presentation position. In still another embodiment, the display screen is operatively connected to a control board configured to provide power and a display signal to the display screen. In yet another embodiment, the display screen further includes an electrical connector mounted therein and accessible from outside the display screen. The electrical connector may be a USB-C connector. In still another embodiment, the mounting frame includes at least one recess having a magnet embedded therein. In another embodiment, the upper slide rail and the lower slide rail include a stopping member at each end.

The present disclosure is further directed to an attachable display device including a mounting frame including an upper track and a lower track, the upper track and the lower track each having an elongated guide slot, a puck slidably attached to the upper track and the lower track at each elongated guide slot, a receiving space disposed between the upper track and the lower track, and at least one magnet attached to the mounting frame opposite the receiving space, a display screen slidably attached to an upper slide rail and a lower slide rail, wherein the upper slide rail and the lower slide rail are operatively connected to the mounting frame by the pucks, the display screen including a pivot joint that couples the display screen to each of the upper slide rail and the lower slide rail and is slidably attached to the upper slide rail and the lower slide rail, a torque hinge operatively connected to the pivot joint, and an electrical connector, wherein the display screen is operable to selectively transition between a closed position in which the display screen is positioned within the receiving space and an open position in which the display screen extends outwardly of the mounting frame to be exposed from one side of the mounting frame, and wherein the torque hinge and the pivot joint are configured so that the display screen rotates relative to the mounting frame to allow the display screen to be placed in an angled configuration.

In this aspect, the display screen may be operatively connected to a control board configured to provide power and a display signal to the display screen. In another embodiment, the display screen is a touch screen display. In still another embodiment, when the attachable display device is in the open position, the upper slide rail and the lower slide rail are configured for slidable deployment to a first horizontal distance and the display screen is configured for slidable deployment along the upper slide rail and the lower slide rail to a second horizontal distance that is greater than the first horizontal distance. In yet another embodiment, when the attachable display screen is in the open position, the display screen is rotatable about the mounting frame to an angle of 180 degrees allowing the display screen to be deployed in a presentation position.

BRIEF DESCRIPTION OF THE DRAWINGS

Further features and advantages can be ascertained from the following detailed description that is provided in connection with the drawings described below.

DETAILED DESCRIPTION

Unless otherwise defined, all terms (including technical and scientific terms) used herein have the same meaning as commonly understood by one of ordinary skill in the art of this disclosure. It will be further understood that terms, such as those defined in commonly used dictionaries, should be interpreted as having a meaning that is consistent with their meaning in the context of the specification and should not be interpreted in an idealized or overly formal sense unless expressly so defined herein. Well known functions or constructions may not be described in detail for brevity or clarity.

The terms "about" and "approximately" shall generally mean an acceptable degree of error or variation for the quantity measured given the nature or precision of the measurements. Typical, exemplary degrees of error or variation are within 20 percent (%), preferably within 10%, and more preferably within 5% of a given value or range of values. Numerical quantities given in this description are approximate unless stated otherwise, meaning that the term "about" or "approximately" can be inferred when not expressly stated.

The terminology used herein is for the purpose of describing particular embodiments only and is not intended to be limiting. As used herein, the singular forms "a", "an" and "the" are intended to include the plural forms as well (i.e., at least one of whatever the article modifies), unless the context clearly indicates otherwise.

Spatially relative terms, such as "under," "below," "lower," "over," "upper," and the like, may be used herein for ease of description to describe one element or feature's relationship to another when the apparatus is right side up as shown in the accompanying drawings.

The present disclosure provides an attachable external display screen for use on electronic devices. More specifically, the display screen may be removably mounted onto a surface of an electronic device to provide the user with an additional display screen. The attachable display screen may be mounted onto any electronic device including, but not limited to, a laptop, tablet, tablet computer, desktop computer, smart phone, television, and gaming system. In one embodiment, the attachable display screen may be mounted onto a portable electronic device, such as a laptop or tablet. The attachable display screen provides users increased functionality and usability while still retaining the portability of the electronic device. The attachable display screen is also adjustable for different sized laptops without moving or adjusting the mounting mechanism.

Figure 1:
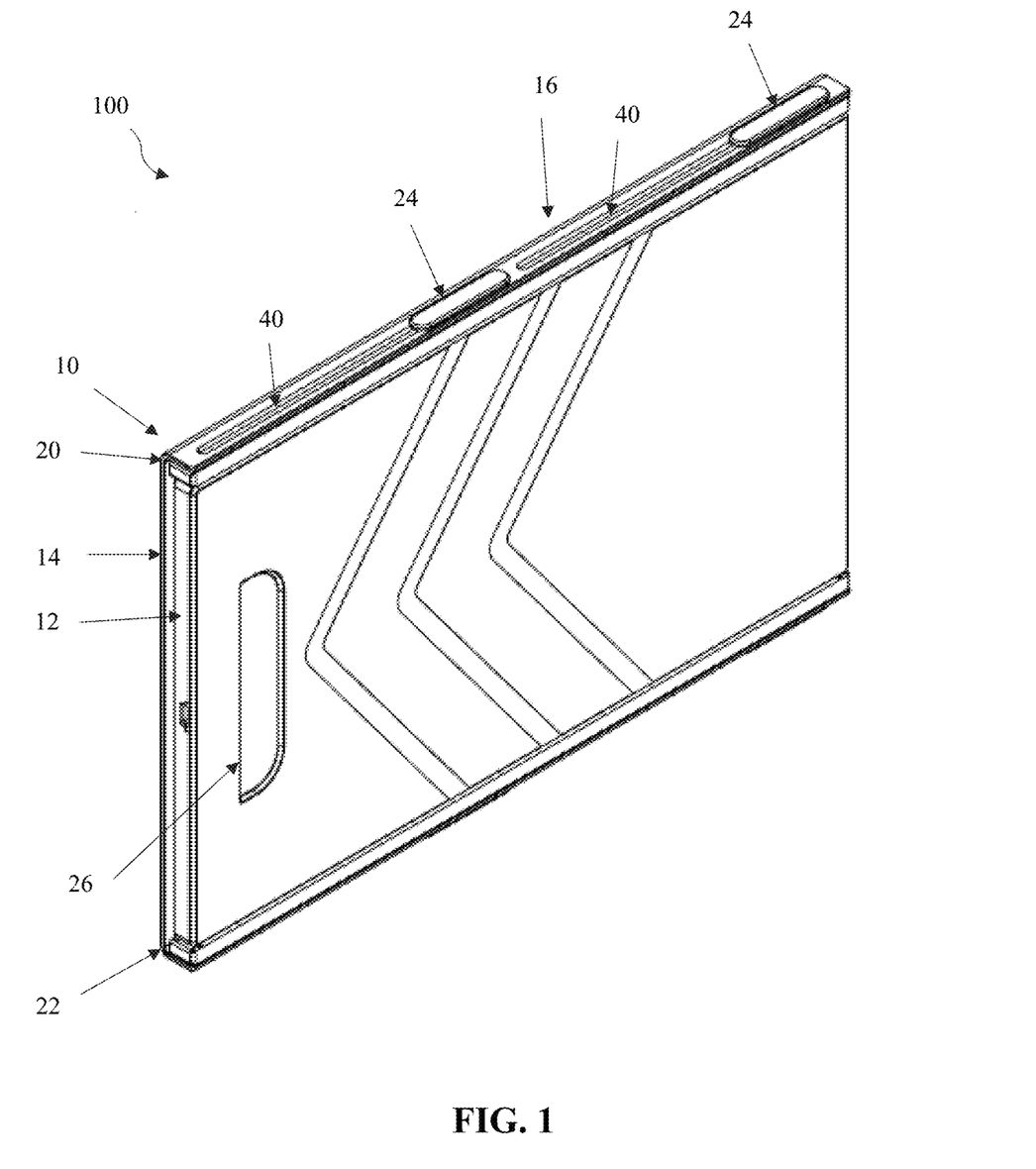
FIG. 1 is a front perspective view of an attachable display device according to an embodiment of the present disclosure.

FIG. 1 is a front perspective view of an attachable display device 100 according to an exemplary embodiment of the present disclosure. FIG. 1 shows the attachable display device 100 in a closed position prior to use. As shown in FIG. 1, the attachable display device 100 includes a mounting frame 10 for housing a display screen 12 therein. The display screen 12 may be any type of external electronic display including, but not limited to, an electroluminescent (ELD) display, liquid crystal display (LCD), light emitting diode (LED) display (e.g., organic light emitting diode (OLED) or microLED), plasma display panel (PDP), quantum dot (QLED) display, and a touch screen display. It is contemplated that the mounting frame 10 and the display screen 12 be ergonomically sized so as to minimize the weight of the attachable display device 100 and reduce stress placed on the user's electronic device. In one embodiment, the total thickness of the attachable display device 100 (including the mounting frame 10 and the display screen 12) is about 12 mm to about 18 mm. In another embodiment, the total thickness of the attachable display device 100 (including the mounting frame 10 and the display screen 12) is about 14 mm to about 17 mm. In still another embodiment, the total thickness of the attachable display device 100 (including the mounting frame 10 and the display screen 12) is about 15 mm to about 16 mm. In an exemplary embodiment, the total thickness of the attachable display device 100 (including the mounting frame 10 and the display screen 12) is about 15.7 mm. As shown in FIG. 1, the back side of the display screen 12 may include an indentation 26 that can serve as a handle to aid the user in pulling the display screen 12 out from the mounting frame 10.

The mounting frame 10 is configured for attachment to a surface of a portable electronic device (not shown), such as to the back of a laptop screen. The mounting frame 10 may be formed of plastic, glass, ceramics, fiber composites, metal (e.g., stainless steel, aluminum, etc.), other suitable materials, or a combination of these materials. In one embodiment, the mounting frame 10 is formed of aluminum.

In the illustrated embodiment, the mounting frame 10 has a back plate 14 that removably attaches to the portable electronic device. The mounting frame 10 also includes an upper track 16 and a lower track (not shown) that operatively engage sliding rails (not shown) on the display screen 12. The upper track 16 and the lower track are spaced apart with one above the other in an essentially parallel relationship to each other. The upper track 16 is positioned at an upper edge 20 of the back plate 14, while the lower track is positioned at a lower edge 22 of the back plate 14.

In one embodiment, the upper track 16 and the lower track include one or more elongated guide slots 40. The guide slots 40 allow for the sliding rails of the display screen 12 to travel along the upper track 16 and the lower track and allow for increased lateral adjustment of the display screen 12. Each guide slot 40 operatively engages a puck 24. The pucks 24 are slidably attached to each of the upper track 16 and the lower track and hold the sliding rails of the display screen 12 in place. The pucks 24 may be attached to the upper track 16 and the lower track by any suitable means including, but not limited to, screws, pins, or projections. The pucks 24 limit the travel of the sliding rails on the display screen 12 to prevent detachment from the mounting frame 10. In the illustrated embodiment, the upper track 16 and the lower track each comprise two elongated guide slots 40 that operatively engage two pucks 24—a puck 24 at each guide slot 40. In another embodiment, the upper track 16 and the lower track may comprise a single elongated guide slot 40 that operatively engages a single puck 24. The pucks 24 may be formed from plastic, ceramics, fiber composites, metal, other suitable materials, or a combination of these materials. In one embodiment, the pucks 24 are formed from injection molded plastic to reduce wear and allow for smooth sliding.

Figure 2:
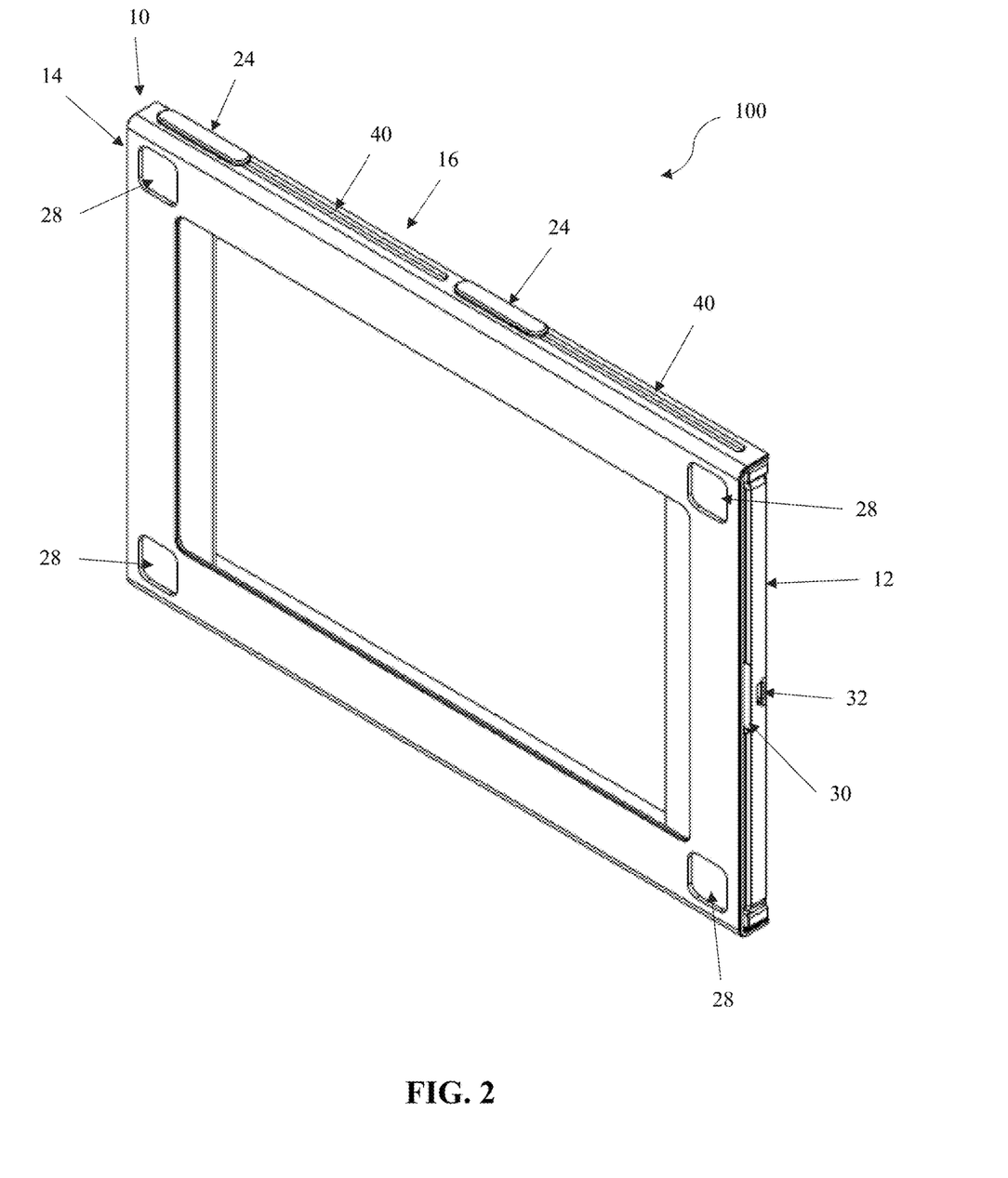
FIG. 2 is a rear perspective view of the attachable display device according to an embodiment of the present disclosure.

FIG. 2 is a rear perspective view of the attachable display device 100 according to an exemplary embodiment of the present disclosure. The mounting frame 10 with the display screen 12 housed therein can be removably mounted onto an electronic device (not shown). As can be seen in FIG. 2, the back plate 14 includes a plurality of recesses 28. Each recess 28 may house a magnet (not shown) therein. In one embodiment, the magnets are embedded within the back plate 14 at each recess 28. The magnets can serve as a means for attaching the attachable display device 100 to the portable electronic device. For instance, in one embodiment, the surface of the portable electronic device to which the attachable display device 100 is to be mounted may include a plurality of metal or steel stickers. The magnets on the back plate 14 can attach to the plurality of metal or steel stickers by a magnetic force, which provides a secure connection onto the electronic device and prevents the attachable display device 100 from moving (but is still removable with sufficient force). In one embodiment, the magnets on the back plate 14 may be complementary in shape to each of the recesses 28 such that each of the magnets fit securely within the recesses 28. In addition, by placing the magnets on the back plate 14 (rather than on the electronic device), there is a reduced risk of the magnets interfering with magnetic storage devices in the electronic device.

In the illustrated embodiment, the back plate 14 includes a recess 28 at each corner. However, the number and arrangement of the recesses 28 (and magnets embedded therein) on the back plate 14 may vary so long as the attachable display device 100 can be securely mounted onto the electronic device. While the use of magnets has been described herein as an exemplary means for attaching the attachable display device 100 to the electronic device, one of ordinary skill in the art will recognize that that the attachable display device 100 may be secured to the electronic device by any suitable means including, but not limited to, by hooks, adhesives, screws, pins, projections, or snap catch elements.

As shown in FIG. 2, the display screen 12 may include a notch 30 to aid the user in pulling the display screen 12 out from the mounting frame 10. The notch 30 may be any suitable shape so long as the notch 30 includes a finger-graspable surface and may be placed at any location on the display screen 12 that is accessible by the user. The display screen 12 also includes an electrical connector 32 for operably connecting the display screen 12 to the electronic device. In one embodiment, the display screen 12 may be operably connected to the electronic device through a direct electrical connection using a cord and a compatible plug for engagement with the electrical connector 32. For instance, the electrical connector 32 may be a USB connector, USB-A connector, USB-C connector, mini-USB connector, micro-USB connector, high definition multimedia interface (HDMI) connector, mini HDMI, DisplayPort, or mini DisplayPort. In one embodiment, the electrical connector 32 is a USB type-C connector for use with a USB type-C cord. In another embodiment, the display screen 12 may be operably connected to the electronic device through a wireless connection. For example, the display screen 12 may be operably connected to the electronic device using Wi-Fi, 802.11ac wireless, DLNA, Bluetooth, NFC, or the like.

Figure 3:
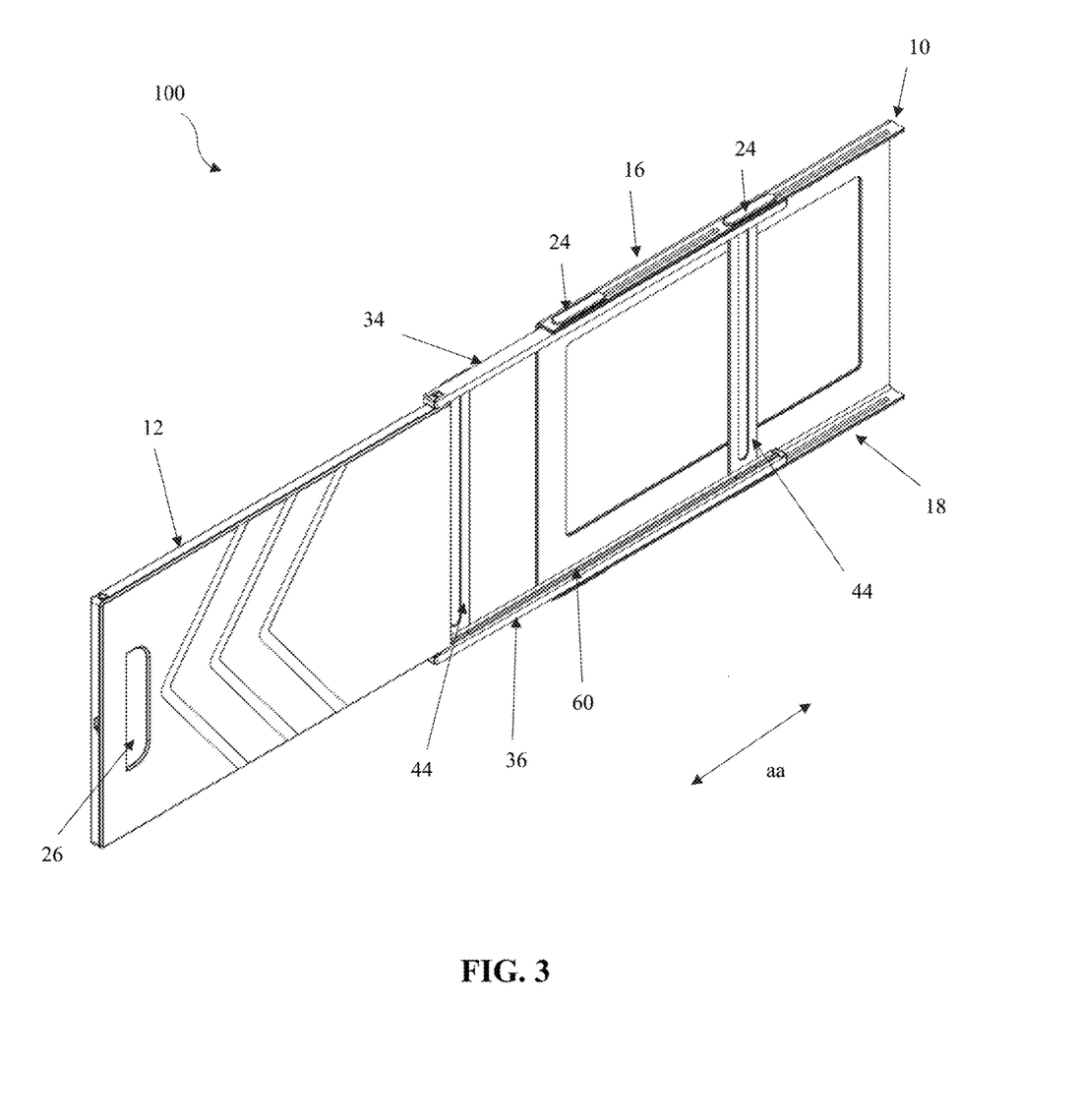
FIG. 3 is a front perspective view of the attachable display device in an extended position according to an embodiment of the present disclosure.

FIG. 3 is a front perspective view of the attachable display device 100 in an extended position. In this aspect, the display screen 12 is positionable in an extended position thereby allowing viewing of both the screen of the electronic device (not shown) and the display screen 12. As shown in FIG. 3, the display screen 12 is configured to slide out of the mounting frame 10 so that a user can utilize a second display screen when the attachable display device 100 is mounted onto the electronic device. The display screen 12 may be slidably deployable along the horizontal axis in either direction. In the illustrated embodiment, the display screen 12 is slidably deployed to the left along the aa-axis. However, the mounting frame 10 may be flipped or inverted so that the display screen 12 is slidably deployable to the right along the aa-axis.

The display screen 12 is slidably deployed in and out of the mounting frame 10 on sliding rails. As shown in FIG. 3, the display screen 12 is operatively connected to an upper slide rail 34 and a lower slide rail 36. More particularly, the upper slide rail 34 is operatively attached to a top surface of the display screen 12 and the lower slide rail 36 is operatively attached to a bottom surface of the display screen 12. The upper slide rail 34 and the lower slide rail 36 are operatively connected to the upper track 16 and the lower track 18, respectively, by the pucks 24. As discussed above, the pucks 24 limit the travel of the upper slide rail 34 and the lower slide rail 36 to prevent detachment of the display screen 12 from the mounting frame 10.

The upper slide rail 34 and the lower slide rail 36 each include a groove 60. The display screen 12 is operatively attached to the upper slide rail 34 and the lower slide rail 36 by a pivot joint (not shown) that travels along the grooves 60 as the display screen 12 is slidably deployed along the aa-axis. The upper slide rail 34 and the lower slide rail 36 are joined using one or more slats 44. The slats 44 ensure the distance between the upper slide rail 34 and the lower slide rail 36 is fixed and that the upper slide rail 34 and the lower slide rail 36 move in parallel alignment.

Figure 4:
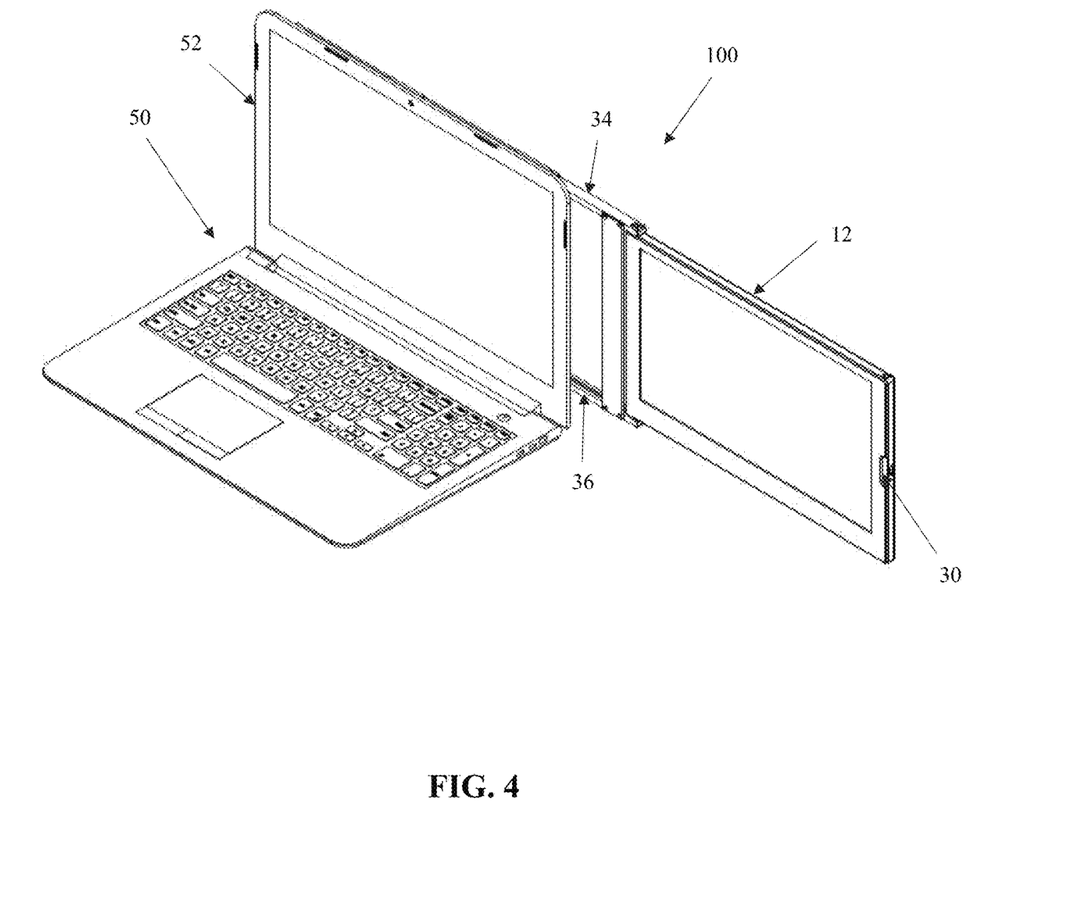
FIG. 4 is a front perspective view of an electronic device having the attachable display device mounted thereon in the extended position according to an embodiment of the present disclosure.

FIG. 4 is a front perspective view of an electronic device 50 having the attachable display device 100 mounted thereon in the extended position. In use, the user may grip the notch 30 and apply a force to slide the display screen 12 out from the mounting frame 10. The attachable display device 100 preferably utilizes a dual sliding mechanism that allows for the display screen 12 to slide out to different lengths relative to the screen 52 of the electronic device 50. As shown in FIG. 4, the upper slide rail 34 and the lower slide rail 36 are operable to slide along the mounting frame 10 to a first distance. In one embodiment, the upper slide rail 34 and the lower slide rail 36 are operable to slide along the mounting frame 10 to a first distance of about 110 mm or less. In another embodiment, the upper slide rail 34 and the lower slide rail 36 are operable to slide along the mounting frame 10 to a first distance of about 98 mm or less. In still another embodiment, the upper slide rail 34 and the lower slide rail 36 are operable to slide along the mounting frame 10 to a first distance of about 95 mm or less. In yet another embodiment, the upper slide rail 34 and the lower slide rail 36 are operable to slide along the mounting frame 10 to a first distance of about 90 mm or less. Once the upper slide rail 34 and the lower slide rail 36 reach the first distance, the display screen 12 is operable to slide along the upper slide rail 34 and the lower slide rail 36 (via the pivot joint) to a second maximum distance that is greater than the first distance. In one embodiment, the second maximum distance may be about 420 mm or less. In another embodiment, the second maximum distance may be about 415 mm or less. In still another embodiment, the second maximum distance may be about 410 mm or less. In yet another embodiment, the second maximum distance may be about 405 mm or less. This dual sliding mechanism allows for the attachable display device 100 to be used on different sized electronic devices, such as different sized laptops, without having to adjust the positioning of the mounting frame 10. For example, the attachable display device 100 can be used on different laptops ranging in size from 13 inches to 17 inches without having to adjust the positioning of the mounting frame 10.

Figure 5:
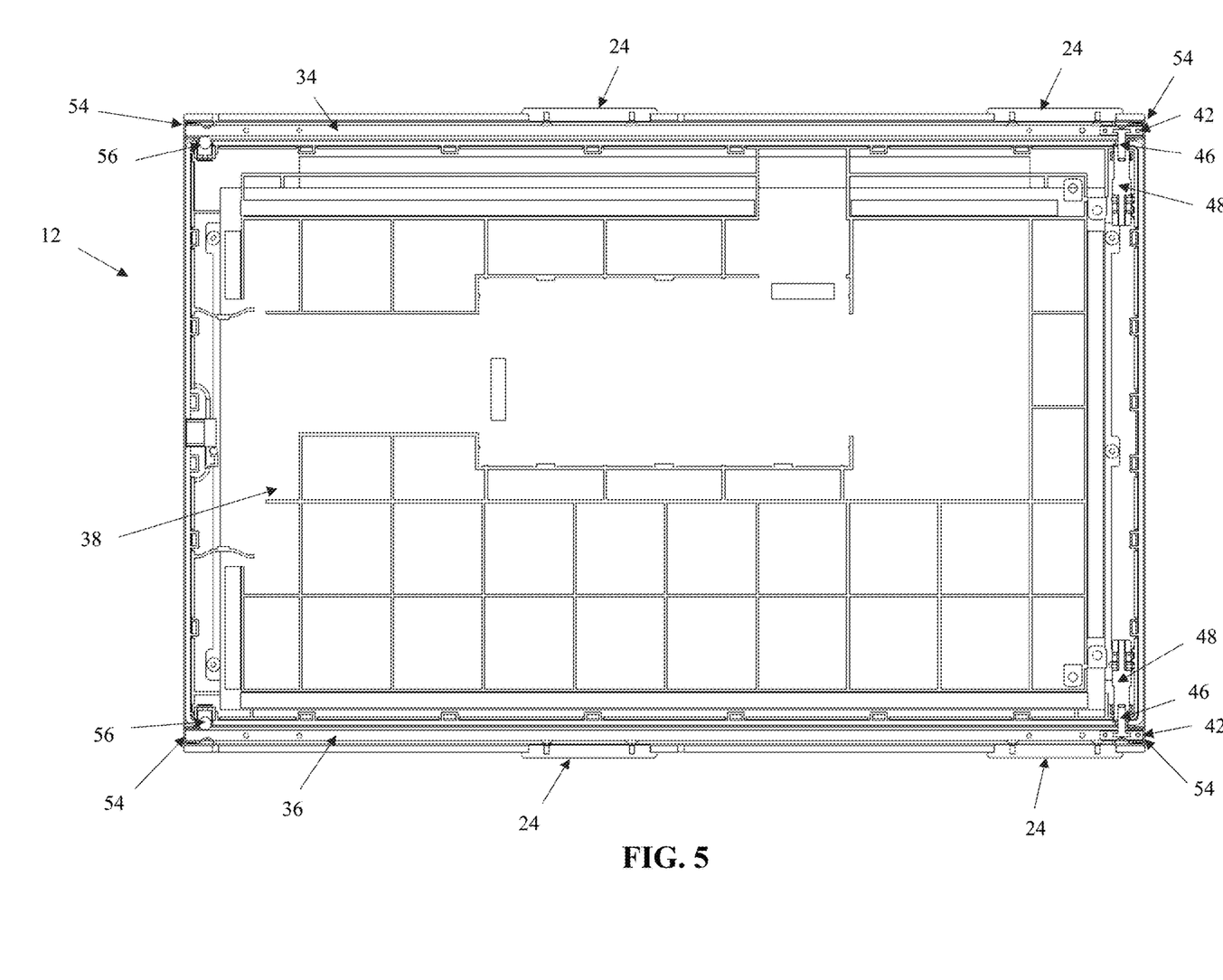
FIG. 5 is an interior view of the attachable display device according to an embodiment of the present disclosure.

FIG. 5 is an interior view of one embodiment of the attachable display device 100. The attachable display device 100 includes various internal components. In the illustrated embodiment, the display screen 12 is operatively connected to a control board 38 that provides power and a display signal to the display screen 12. The control board 38 may be any type of integrated circuit that is operable to transmit data from the electronic device 50 to the display screen 12. The attachable display device 100 may also include other internal components including, but not limited to, electrical components such as display driver circuitry, one or more batteries, sensors, microphones, speakers, integrated circuits, microprocessors, power management units, radio-frequency transceiver circuitry, baseband processor circuitry, discrete components such as capacitors, resistors, and inductors, switches, vibrators, connectors, printed circuit boards, wires, transmission lines, and other electrical devices. The internal components may be mounted on one or more substrates such as rigid printed circuit boards (e.g., boards formed from fiberglass-filled epoxy such as FR4 printed circuit boards on which patterned metal traces have been formed), flexible printed circuit boards (e.g., "flex circuits" formed form sheets of polymer such as polyimide on which patterned conductive traces have been formed), rigid flex (e.g., boards with both rigid portions and flex circuit tails), plastic carriers, or other substrates.

The display screen 12 is operatively connected to the upper slide rail 34 and the lower slide rail 36 by a pivot joint 42. The pivot joint 42 slides along each of the upper slide rail 34 and the lower slide rail 36 when the display screen 12 slides in and out of the mounting frame 10. The pivot joint 42 is operatively connected to the display screen 12 by a post 46 that is embedded within the display screen 12. The pivot joints 42 and the posts 46 are located on the side opposite to the side of the display screen 12 that will be slidably deployed from the mounting frame 10. For instance, if the display screen 12 will be slidably deployed to the left, the pivot joints 42 and the posts 46 should be located on the right side of the display screen 12 (as illustrated). This allows for each of the pivot joints 42 to slide along the upper slide rail 34 and the lower slide rail 36. As shown in FIG. 5, the display screen 12 includes a pivot joint 42 at a top right corner and a bottom right corner (i.e., the display screen 12 is operable to be slidably deployed to the left). Each pivot joint 42 is operatively attached to the display screen 12 by the post 46. While the pivot joints 42 are configured for sliding inside the upper slide rail 34 and the lower slide rail 36, the pivot joints 42 also allow for the display screen 12 to be pivotally connected to the upper slide rail 34 and the lower slide rail 36. Through the use of this pivot connection, the user can adjust the angle of the display screen 12.

The post 46 of each pivot joint 42 is operatively attached to a torque hinge 48. The torque hinge 48 is embedded within the display screen 12 and is positioned below the upper pivot joint 42 and above the lower pivot joint 42. The torque hinge 48 is designed to provide continual resistance throughout the entire range of motion in adjusting the display screen 12, making it possible to easily position the display screen 12 securely at a desired angle. Any suitable torque hinge or constant torque friction hinge may be used in accordance with the present disclosure.

The upper slide rail 34 and the lower slide rail 36 each comprise a stop member 54. The stop member 54 is located at each end of the upper slide rail 34 and the lower slide rail 36. The stop member 54 prevents detachment of the display screen 12 from the upper slide rail 34 and the lower slide rail 36 in case the pulling force applied to the display screen 12 by the user is excessive. In addition, the stop member 54 helps lock the display screen 12 in either the closed position (as shown in FIG. 1) or the extended position (as shown in FIG. 4). The stop member 54 may be any suitable stopping mechanism including, but not limited to, endcaps, plugs, pins, or spring detents. In one embodiment, the stop member 54 is a stamped spring steel endcap.

The upper slide rail 34 and the lower slide rail 36 also each comprise a ball detent 56. Each ball detent 56 is embedded within the display screen 12 and is located at a top and bottom corner on the side of the display screen 12 that will be slidably deployed from the mounting frame 10. The ball detents 56 hold the display screen 12 in position when the display screen 12 is in the closed position (as shown in FIG. 1) and allow for the display screen 12 to be deployed from the closed position with normal force. Ball detents, such as ball plungers, or any other suitable detent mechanisms may be used in accordance with the present disclosure. The use of ball detents 56 is merely illustrative.

Figure 6:
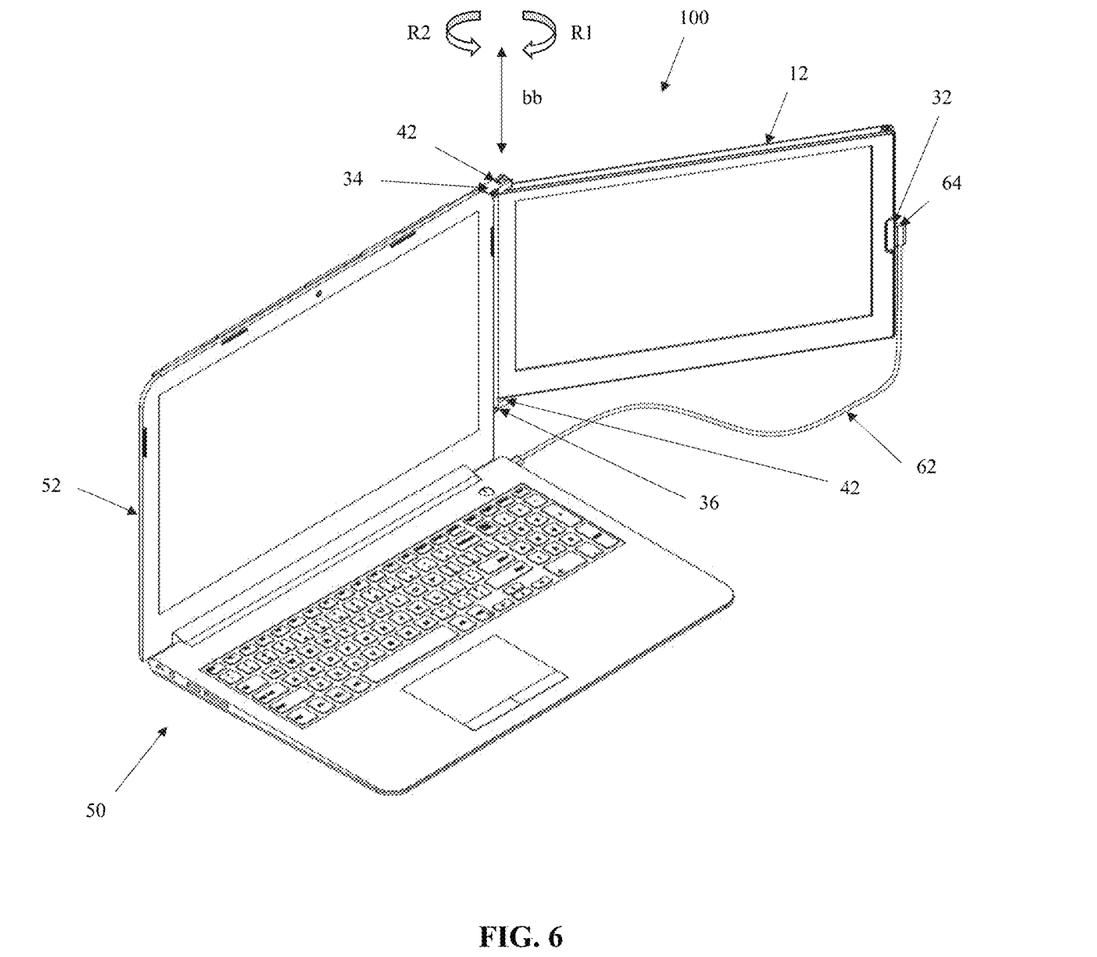
FIG. 6 is a front perspective view of the electronic device having the attachable display device mounted thereon in the extended position and where the display screen is angled.

FIG. 6 is a front perspective view of the electronic device 50 having the attachable display device 100 mounted thereon in the extended position and where the display screen 12 is in an angled position. As briefly discussed above, the pivot joints 42 allow for the display screen 12 to be pivotally connected to the upper slide rail 34 and the lower slide rail 36 along a vertical axis bb. In this aspect, the pivot joints 42 allow the display screen 12 to rotate relative to the electronic device 50 about rotation directions R1 and R2 which are opposite to each other. When rotated in direction R1, the display screen 12 may be angled toward the user as shown in FIG. 6. The display screen 12 can be rotated in direction R1 until the display screen 12 interferes with the screen 52 of the electronic device 50. When rotated in direction R2, the display screen 12 may be angled away from the user. In other words, the pivot joint 42 allows the display screen 12 to adjust from a plane-like display as shown in FIG. 4 to an angled display state as shown in FIG. 6 which allows the user to obtain a preferable view angle range and visual effect.

In the illustrated embodiment of FIG. 6, the display screen 12 is operatively connected to the electronic device 50 through a direct electrical connection using a USB cord 62 and a compatible plug 64 for engagement with the electrical connector 32, which is a USB connector. However, as discussed above, the display screen 12 may be operatively connected to the electronic device 50 by any suitable electrical connection.

Figure 7:
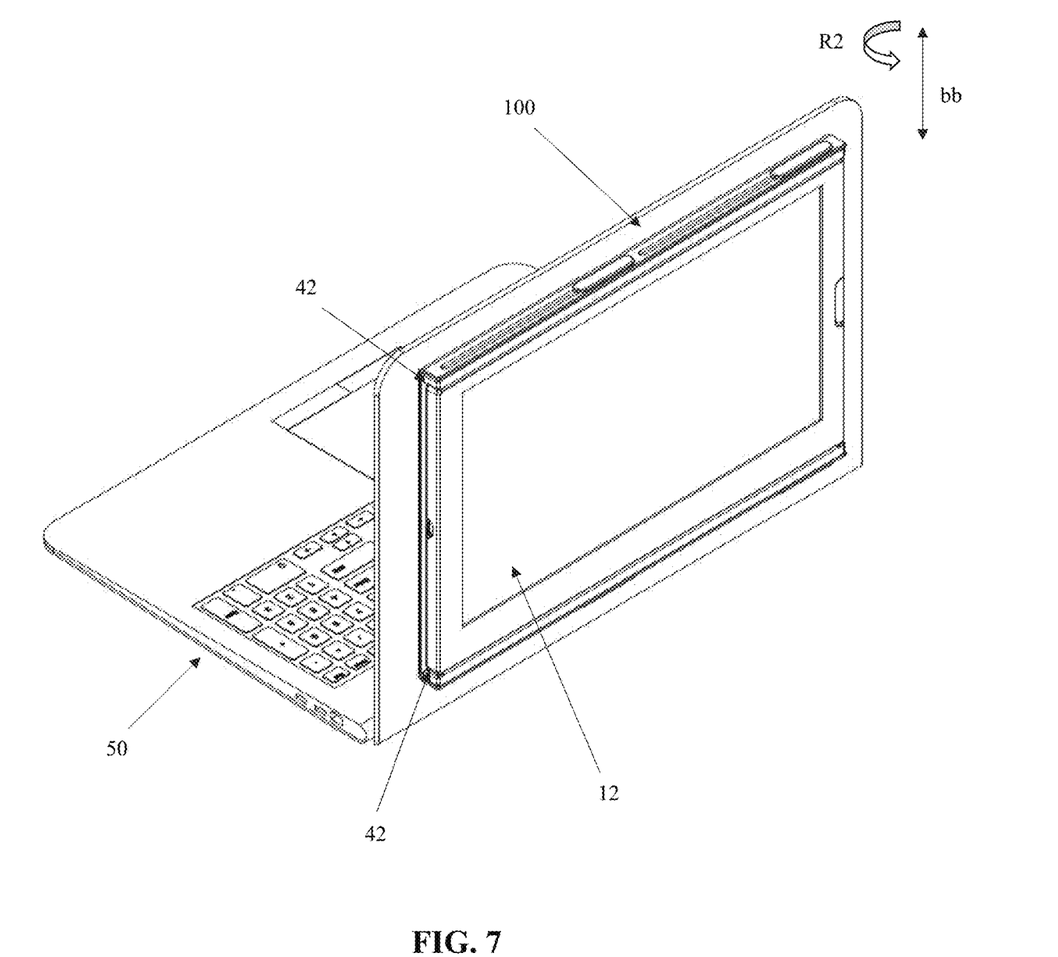
FIG. 7 is a rear perspective view of the electronic device having the attachable display device mounted thereon in a presentation position.

FIG. 7 is a rear perspective view of the electronic device 50 having the attachable display device 100 mounted thereon in a presentation position. As can be seen in FIG. 7, the pivot joints 42 allow for the display screen 12 to fully rotate in direction R2 along vertical axis bb to an angle of 180 degrees such that the display screen 12 can be viewed from the rear of the electronic device 50. This allows for the display screen 12 to be deployed in a presentation position for viewing by another user opposite the user positioned in front of the electronic device 50.

The various components of the attachable display device 100 described herein may be constructed or manufactured from materials, such as various polymers, plastics, stainless steel, aluminum, and combinations thereof. Similarly, the various parts described herein may be constructed according to various manufacturing methods including injection molding, milling, forging, extrusion, pressing, 3D printing, and other related manufacturing methods.

The device described and claimed herein is not to be limited in scope by the specific embodiments herein disclosed, since these embodiments are intended as illustrations of several aspects of the disclosure. Any equivalent embodiments are intended to be within the scope of this disclosure. Indeed, various modifications of the device in addition to those shown and described herein will become apparent to those skilled in the art from the foregoing description. Such modifications are also intended to fall within the scope of the appended claims. All patents and patent applications cited in the foregoing text are expressly incorporated herein by reference in their entirety.

What is claimed is:

1. An attachable display device, comprising:
   a mounting frame comprising:
   an upper track comprising a first elongated through hole guide slot and a lower track comprising a second elongated through hole guide slot,
   a first puck operatively coupled to the upper track via the first elongated through hole guide slot and a second puck operatively coupled to the lower track via the second elongated through hole guide slot,
   a receiving space disposed between the upper track and the lower track, and
   at least one magnet attached to the mounting frame opposite the receiving space,
   a display screen operatively coupled to an upper slide rail via a first pivot joint and a lower slide rail via a second pivot joint, wherein the first and second pivot joints are movable within the upper and lower slide rails, and wherein the upper and lower slide rails are slidable along the first and second elongated through hole guide slots, the display screen comprising:
   a first torque hinge operatively connected to the first pivot joint and a second torque hinge operatively connected to the second pivot joint, and
   an electrical connector,
   wherein the display screen is operable to selectively transition between a closed position in which the display screen is positioned within the receiving space and an open position in which the display screen extends outwardly of the mounting frame to be exposed from one side of the mounting frame, and
   wherein the torque hinges and the pivot joints are configured so that the display screen rotates relative to the mounting frame to allow the display screen to be placed in an angled configuration.

2. The attachable display device of claim 1, wherein, in the open position, the upper slide rail and the lower slide rail are configured for slidable deployment to a first horizontal distance and the display screen is configured for slidable deployment along the upper slide rail and the lower slide rail to a second horizontal distance that is greater than the first horizontal distance.

3. The attachable display device of claim 1, wherein the display screen is operatively connected to a control board configured to provide power and a display signal to the display screen.

4. The attachable display device of claim 1, wherein, in the open position, the display screen is rotatable about the mounting frame to an angle of 180 degrees allowing the display screen to be deployed in a presentation position.

5. The attachable display device of claim 1, wherein the display screen is a touch screen display.

6. The attachable display device of claim 1, wherein the first and second pivot joints are movable within the upper and lower slide rails along a horizontal axis.

7. An attachable display device, comprising:
   a mounting frame comprising:
   an upper track comprising a first elongated through hole guide slot and a lower track comprising a second elongated through hole guide slot,
   a first puck operatively coupled to the upper track via the first elongated through hole guide slot and a second puck operatively coupled to the lower track via the second elongated through hole guide slot, and
   a receiving space disposed between the upper track and the lower track,
   a display screen operatively coupled to an upper slide rail via a first pivot joint and a lower slide rail via a second pivot joint, wherein the first and second pivot joints are movable within the upper and lower slide rails, and wherein the upper and lower slide rails are slidable along the first and second elongated through hole guide slots, the display screen comprising:
   a first torque hinge operatively connected to the first pivot joint and a second torque hinge operatively connected to the second pivot joint, wherein the display screen is rotatable about a vertical axis via the pivot joints and the torque hinges,
   wherein the display screen is operable to selectively transition between a closed position in which the display screen is positioned within the receiving space and an open position in which the display screen extends outwardly of the mounting frame to be exposed from one side of the mounting frame, and wherein, in the open position, the display screen is configured to be slidably deployed to varying horizontal distances.

8. The attachable display device of claim 7, wherein, in the open position, the upper slide rail and the lower slide rail are configured for slidable deployment to a first horizontal distance and the display screen is configured for slidable deployment along the upper slide rail and the lower slide rail to a second horizontal distance that is greater than the first horizontal distance.

9. The attachable display device of claim 7, wherein the display screen is rotatable about the vertical axis to an angle of 180 degrees allowing the display screen to be deployed in a presentation position.

10. The attachable display device of claim 7, wherein the display screen is operatively connected to a control board configured to provide power and a display signal to the display screen.

11. The attachable display device of claim 7, wherein the display screen further comprises an electrical connector mounted therein and accessible from outside the display screen.

12. The attachable display device of claim 11, wherein the electrical connector is a USB-C connector.

13. The attachable display device of claim 7, wherein the mounting frame comprises at least one recess having a magnet embedded therein.

14. The attachable display device of claim 7, wherein the upper slide rail and the lower slide rail comprise a stopping member at each end.

15. An attachable display device, comprising:
a frame comprising an upper track, a lower track, and a receiving space disposed therebetween,
wherein the upper track comprises a first elongated through hole guide slot and the lower track comprises a second elongated through hole guide slot,
a first puck operatively coupled to the first elongated through hole guide slot and a second puck operatively coupled to the track second elongated through hole guide slot,
a display screen operatively coupled to an upper slide rail via a first pivot joint and a lower slide rail via a second pivot joint, wherein the first and second pivot joints are movable within the upper and lower slide rails, and wherein the upper slide rail and the lower slide rail are slidable along the upper and lower tracks,
wherein the display screen is rotatable about a vertical axis via the pivot joints, and
further comprising a first torque hinge operatively connected to the first pivot joint and a second torque hinge operatively connected to the second pivot joint,
wherein the display screen is operable to selectively transition between a closed position in which the display screen is positioned within the receiving space and an open position in which the upper slide rail and the lower slide rail are configured for slidable deployment along the upper track and the lower track to a first horizontal distance and display screen is configured for slidable deployment along the upper slide rail and the lower slide rail to a second horizontal distance.

16. The attachable display device of claim 15, wherein the first and second pivot joints are each operatively connected to the display screen by a post on each of the first and second torque hinges that is embedded within the display screen.

17. The attachable display device of claim 15, wherein the display screen further comprises an electrical connector mounted therein and accessible from outside the display screen.

18. The attachable display device of claim 15, wherein the second horizontal distance is greater than the first horizontal distance.

\* \* \* \* \*

UNITED STATES PATENT AND TRADEMARK OFFICE
CERTIFICATE OF CORRECTION

PATENT NO. : 11,209,869 B2  
APPLICATION NO. : 16/289315  
DATED : December 28, 2021  
INVENTOR(S) : Edward Tyler Hudgins and Antoine Planche Page 1 of 1

It is certified that error appears in the above-identified patent and that said Letters Patent is hereby corrected as shown below:

On the Title Page

Item (54), and In the Specification, Column 1, Lines 1-2, should read:
-- ATTACHABLE DISPLAY SCREEN FOR ELECTRONIC DEVICES --

Signed and Sealed this  
Eighth Day of March, 2022

Drew Hirshfeld  
*Performing the Functions and Duties of the*  
*Under Secretary of Commerce for Intellectual Property and*  
*Director of the United States Patent and Trademark Office*